United States Patent
Tanaka

(10) Patent No.: US 9,759,744 B2
(45) Date of Patent: Sep. 12, 2017

(54) CONTACT INSPECTION DEVICE

(71) Applicant: Kabushiki Kaisha Nihon Micronics, Tokyo (JP)

(72) Inventor: Kentaro Tanaka, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 591 days.

(21) Appl. No.: 13/936,421

(22) Filed: Jul. 8, 2013

(65) Prior Publication Data
US 2014/0021976 A1   Jan. 23, 2014

(30) Foreign Application Priority Data

Jul. 23, 2012   (JP) .................................. 2012-162912

(51) Int. Cl.
  *G01R 31/20*   (2006.01)
  *G01R 1/073*   (2006.01)
  *G01R 1/067*   (2006.01)

(52) U.S. Cl.
  CPC ..... *G01R 1/07364* (2013.01); *G01R 1/06716* (2013.01); *G01R 1/06738* (2013.01); *G01R 1/07357* (2013.01)

(58) Field of Classification Search
None
See application file for complete search history.

(56) References Cited

U.S. PATENT DOCUMENTS 4,699,445 A * 10/1987 Porta ...................... H01R 13/11
                                                              439/698
5,061,192 A * 10/1991 Chapin .............. H01R 13/2414
                                                              439/591
(Continued)

FOREIGN PATENT DOCUMENTS

EP           1179734 A    2/2002
JP        2001-281266 A   10/2001
(Continued)

OTHER PUBLICATIONS

Office Action mailed Jul. 1, 2014 for the corresponding Korean Application No. 10-2013-0085890.
(Continued)

*Primary Examiner* — Paresh Patel
(74) *Attorney, Agent, or Firm* — Leason Ellis LLP

(57) ABSTRACT

A contact inspection device including contacts that contact with a test object for inspection, each contact having a base end portion, a needle tip portion having a needle tip that contacts with the test object, and an elastically deformable portion located between the base end portion and the needle tip portion, with the base end portion and the needle tip portion having axes which coincide with each other. The elastically deformable portion is deformable under a compressive force applied in the axial direction of the needle tip portion while the needle tip is pressed against the test object and converts the compressive force into a tilting motion of the needle tip portion about the needle tip through deformation. The needle tip portion is displaceable in a direction in which the needle tip portion is pivotally tilted while the needle tip is pressed against the test object.

19 Claims, 16 Drawing Sheets

(56) References Cited

U.S. PATENT DOCUMENTS

| | | | | |
|---|---|---|---|---|
| 5,230,632 | A | * | 7/1993 | Baumberger ........ H01R 12/714 |
| | | | | 439/591 |
| 5,952,843 | A | | 9/1999 | Vinh |
| 6,419,500 | B1 | * | 7/2002 | Kister ................ G01R 1/07357 |
| | | | | 439/66 |
| 7,649,367 | B2 | * | 1/2010 | Kister ................ G01R 1/06733 |
| | | | | 324/755.08 |
| 7,671,610 | B2 | | 3/2010 | Kister |
| 2007/0152686 | A1 | | 7/2007 | Kister |

FOREIGN PATENT DOCUMENTS

| | | |
|---|---|---|
| JP | 2004-340654 A | 12/2004 |
| JP | 2009-031087 A | 2/2009 |
| JP | 2009-115798 A | 5/2009 |
| JP | 2010-210340 A | 9/2010 |
| JP | 2011-232313 A | 11/2011 |
| JP | 2012-112709 A | 6/2012 |
| JP | 2012-242178 A | 12/2012 |
| KR | 10-2010-0110069 | 10/2010 |
| TW | 200639408 A | 11/2006 |
| TW | 201202708 A | 1/2012 |

OTHER PUBLICATIONS

Office Action and Search Report mailed Oct. 1, 2014 for the related Taiwanese Patent Application No. 102124009.

Office Action dated Jan. 7, 2016 for the corresponding Japanese Application No. 2012-162912.

Office Action dated Jun. 29, 2016 for the corresponding Japanese Patent Application No. 2012-162912.

* cited by examiner

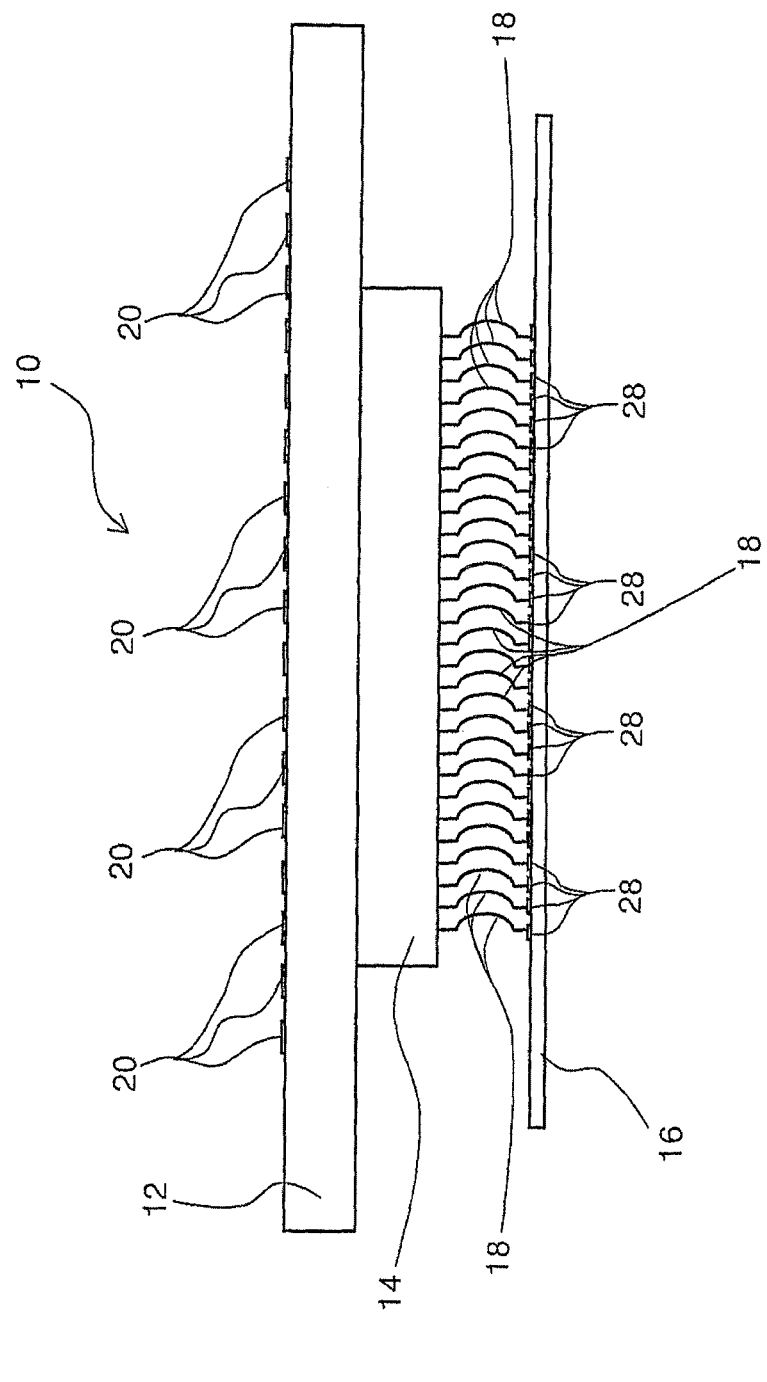
FIG. 1
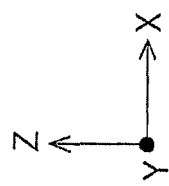

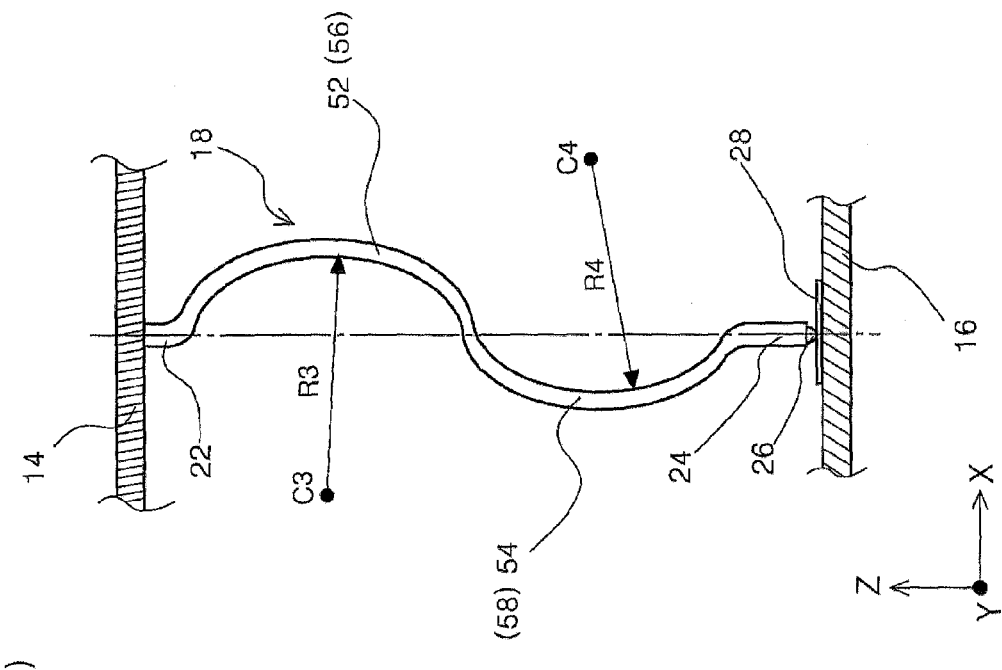
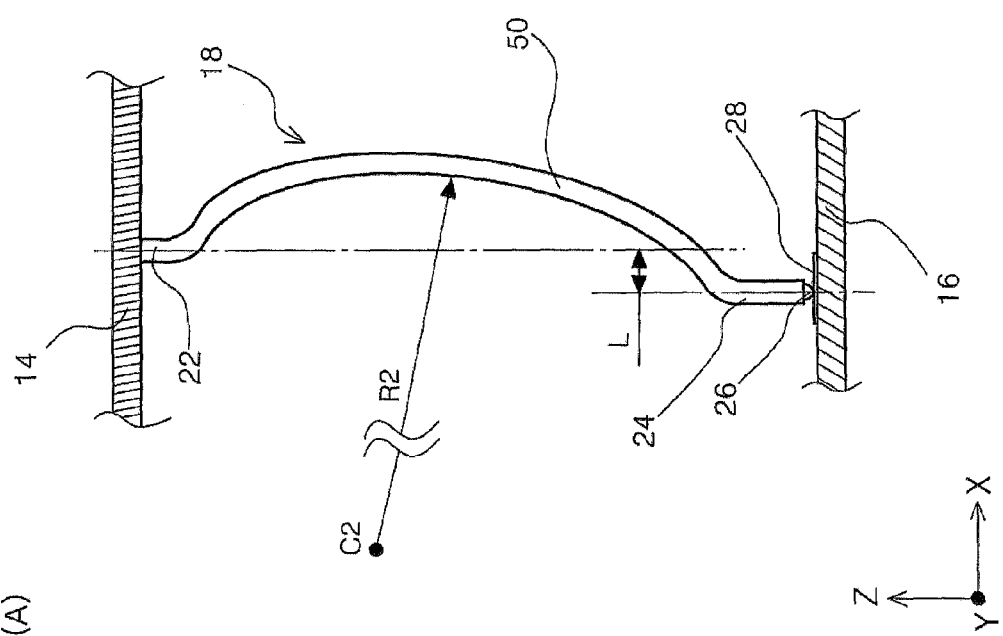

FIG.11
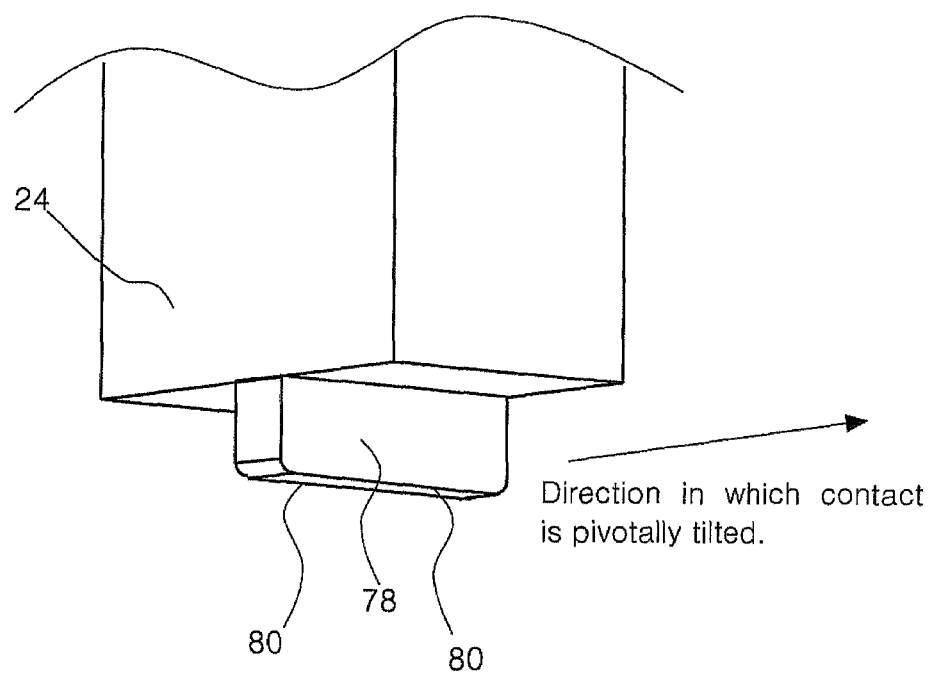
Direction in which contact is pivotally tilted.
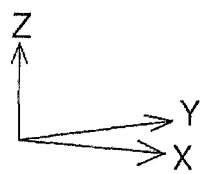

FIG. 15
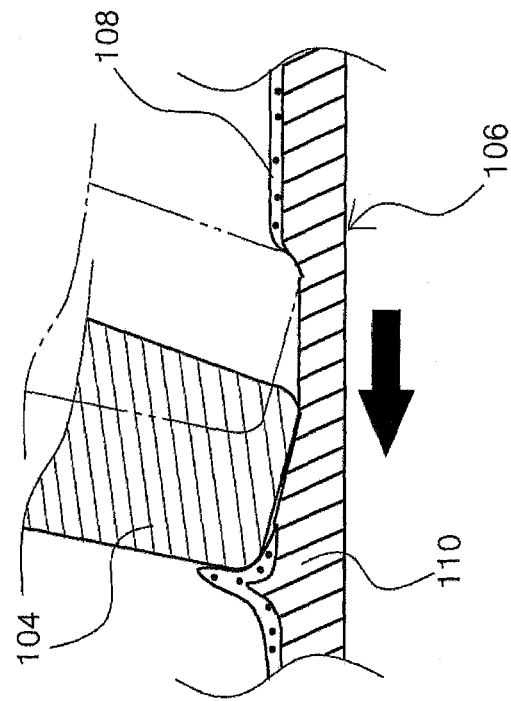
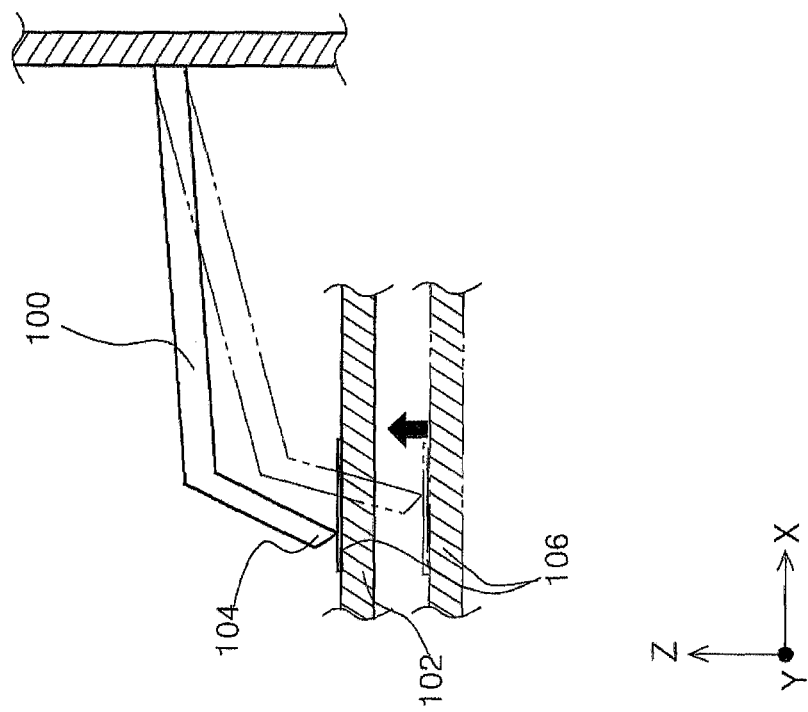

CONTACT INSPECTION DEVICE

This application claims the benefit of Japanese Patent Application No. 2012-162912, filed Jul. 23, 2011, which is incorporated by reference in its entity herein.

FIELD OF THE INVENTION

The present invention relates to a contact inspection device for use in an energization test of semiconductor integrated circuits and so on.

BACKGROUND OF THE INVENTION

An energization test is conventionally performed on test objects such as semiconductor integrated circuits, to determine whether or not the test objects are produced to the exact specifications. A contact inspection device having a plurality of contacts which is pressed against respective electrodes of a test object, such as a probe card, probe unit or probe block, is used in such an energization test. A contact inspection device of this type is used to connect the electrodes of a test object to a tester electrically for inspection.

A contact inspection device of this type includes a first substrate, a second substrate provided over the first substrate, and a plurality of contacts anchored at only one end, i.e., cantilever-type contacts, disposed on the surface of the second substrate to be opposed to a test object and electrically connected to the first substrate via the second substrate (Patent Literature 1, for example).

Another contact inspection device includes needle-type contacts made from a conductive thin metal wire instead of the cantilever-type contacts (Patent Literature 2, for example). The contact inspection device including the needle-type contacts is generally known as vertical probe card.

RELATED ART DOCUMENT

Patent Literature

[Patent Literature 1] JP-A-2004-340654
[Patent Literature 2] JP-A-2010-210340

Problem to be Solved by the Invention

In the case of a contact inspection device having cantilever-type contacts, cantilever-type contacts 100 are brought into contact with electrodes 106 of a test object 102 as shown in FIG. 15(A) to perform an energization test. When the energization test is performed, the test object 102 is usually displaced in the +Z direction (refer to FIG. 15(A)) to press the electrodes 106 of the test object 102 against needle tips 104 of the contacts 100.

At this time, as shown in FIG. 15(B), the needle tip 104 of each contact 100 slides on a surface of an electrode 106 of the test object 102 in the −X direction along the X-axis in FIG. 15(A) and applies a frictional action to the surface. Then, the needle tip 104 removes an oxide film layer 108 formed on the surface of the electrode 106 by the frictional action and establishes an electrical contact with a conductive material layer 110 of the electrode 106, whereby the needle tip 104 is brought into an energized state.

However, the oxide film layer 108 removed by the needle tip 104 turns into shavings. The portion of the oxide film, which has turned into shavings, adheres to the needle tip 104 or is fusion-bonded to the needle tip 104 upon application of a current. Because the portion of the oxide film is not electrically conductive, the contact resistance of the contacts 100 increases every time an energization test is performed. Finally, the shavings that have adhered or have been fusion-bonded to the contacts 100 make it impossible to perform a normal energization test.

In addition, because the oxide film layer 108 is removed by the sliding action of the contact 100, a large scratch mark is left on the surface of each electrode 106. In other words, a large recess is formed in the surface of each electrode 106. The scratch mark, which is depressed relative to the surrounding surface without a scratch mark, increases the possibility of connection failure in bonding when the test object is mounted on a product, or may cause a reduction in durability of the electrode 106 of the test object.

In the case of a contact inspection device having needle-type contacts, after needle-type contacts 112 are brought into contact with electrodes 116 of a test object 114 as shown in FIG. 16(A), the test object 114 is displaced in the +Z direction (refer to FIG. 16(A)) to press the electrodes 116 of the test object 114 against needle tips 118 of the contacts 112.

At this time, the needle tip 118 of each contact 112 pierces an oxide film layer 120 formed on a surface of each electrode 116 of the test object 114 as shown in FIG. 16(B) and establish an electrical contact with a conductive material layer 122 of the electrode 116, whereby the needle tip 118 are brought into an energized state.

However, in the contact inspection device, the electrodes 116 may be damaged because a contact pressure above a certain level needs to be applied to stabilize the electrical contact between the needle tips 118 and the conductive material layer 122, and the contact pressure is entirely applied to the electrodes 116 of the test object 114.

In addition, as in the case of the cantilever-type contacts 100, the problem also exists in the needle type contacts 112 that adhesion or fusion-bonding of a portion of the oxide film layer 120 as shavings to the contacts 112 may occur between the contacts 112 and the electrodes 116, making it impossible to perform a normal energization test.

SUMMARY OF THE INVENTION

The present invention has been made in view of the above problems, and it is, therefore, an object of the present invention to provide a contact inspection device having contacts which do not cause damage to the electrodes of the test object and can establish a stable electrical connection with the electrodes of the test object.

Means for Solving the Problem

For the purpose of accomplishing the object, a contact inspection device according to a first aspect of the present invention is a contact inspection device including contacts to be brought into contact with a test object for inspection, each contact including: a base end portion; a needle tip portion having a needle tip to be brought into contact with the test object; and an elastically deformable portion being located between the base end portion and the needle tip portion, in which the base end portion and the needle tip portion has axes which coincide with each other, the elastically deformable portion is deformable under a compressive force applied in a direction of the axis of the needle tip portion while the needle tip is pressed against the test object to convert the compressive force into a pivotal tilting motion of the needle tip portion about the needle tip thereof through the deformation, and the contact inspection device is configured such that the needle tip portion of each contact is displaceable in a direction in which the needle tip portion is pivotally tilted about the needle tip thereof with the needle tip being pressed against the test object.

The phrase "axes which coincide with each other" does not mean exact coincidence between the axis of the base end portion and the axis of the needle tip portion. It means that the axes may be offset from each other in the direction in which the needle tip portion is pivotally tilted or in a direction opposite the direction in which the needle tip portion is pivotally tilted, as long as the needle tip portion can be pivotally tilted about the needle tip.

According to this aspect, each contact of the contact inspection device has an elastically deformable portion between the base end portion and the needle tip portion. The elastically deformable portion is comprised, to deform under a compressive force applied in the direction of the axis of the needle tip portion with the needle tip being pressed against the test object and, to convert the compressive force into a pivotal tilting motion of the needle tip portion about the needle tip thereof through the deformation. In other words, the needle tip portion of each contact is displaced pivotally about the needle tip thereof when the needle tip is brought into pressure contact with the test object.

In addition, in the contact inspection device, the needle tip portion of each contact is displaceable in the direction in which the needle tip portion is pivotally tilted. In other words, there is nothing that restricts the needle tip portion from being displaced in the direction.

Thus, during the test, the needle tip portion of each contact is displaced pivotally about the needle tip thereof when the needle tip is brought into pressure contact with the test object. Thus, the needle tip is prevented from making a sliding motion relative to the test object and hardly scratches an oxide film layer off an electrode. Thus, the contact inspection device of this aspect can prevent damage to electrodes of the test object during inspection.

In the contact inspection device of this aspect, the needle tip portion of each contact is pivotally tilted about the needle tip thereof on an electrode. Thus, when the needle tip portion is pivotally tilted, friction between the oxide film layer and the needle tip makes the conductive material of the electrode exposed from a part of the oxide film layer on the surface of the electrode in contact with the needle tip. Because the needle tip of the contact is brought into contact with the exposed conductive material, a good electrical connection is established between the contact and the electrode.

A contact inspection device according to a second aspect of the present invention is a contact inspection device including contacts to be brought into contact with a test object for inspection, each contact including: a base end portion; a needle tip portion having a needle tip to be brought into contact with the test object; and an elastically deformable portion being located between the base end portion and the needle tip portion, in which the base end portion and the needle tip portion has axes which coincide with each other, the elastically deformable portion has an arcuate portion protruding in a direction perpendicular to the axes of the base end portion and the needle tip portion, the arcuate portion is configured such that a center point of a circle formed by the arcuate portion is located on an opposite side of the arcuate portion with respect to the axes of the base end portion and the needle tip portion, and the contact inspection device is configured such that the needle tip portion of each contact is displaceable in a direction in which the arcuate portion protrudes while the needle tip is pressed against the test object.

As in the case of the first aspect, the phrase "axes which coincide with each other" does not mean exact coincidence between the axis of the base end portion and the axis of the needle tip portion. It means that the axes may be offset from each other in the direction in which the needle tip portion is pivotally tilted or in a direction opposite the direction in which the needle tip portion is pivotally tilted, as long as the needle tip portion can be pivotally tilted about the needle tip.

According to this aspect, the elastically deformable portion of each contact has an arcuate portion protruding in a direction perpendicular to the axes of the base end portion and the needle tip portion. The arcuate portion is configured such that the center of the circle, of which the arcuate portion forms a part, is located on the opposite side of the arcuate portion with respect to the axes of the base end portion and the needle tip portion. The configuration of the contact enables the needle tip portion of the contact to be displaced pivotally about the needle tip thereof when the needle tip is pressed against the test object.

In addition, in the contact inspection device, the needle tip portion of each contact is formed to be displaceable in the direction in which the needle tip portion is pivotally tilted. In other words, there is nothing that restricts the needle tip portion from being displaced in the pivotally tilted direction.

Thus, during the test, the needle tip portion of each contact is displaced pivotally about the needle tip thereof when the needle tip is brought into pressure contact with the test object. This produces effects similar to those of the first aspect.

According to the first or second aspect, a third aspect of the present invention is characterized by the elastically deformable portion having an arcuate portion protruding in a direction perpendicular to the axes of the base end portion and the needle tip portion, and the arcuate portion being formed in the shape of an arc.

As used herein, the term "arc" refers not only to a shape consisting of one curve such as circle or ellipse but also to a shape consisting of a plurality of straight lines and similar to a circle such as polygon.

According to this aspect, in addition to the effects similar to those of the first or second aspect, the elastically deformable portion is formed in the shape of an arc protruding in a direction perpendicular to the axes of the base end portion and the needle tip portion. Thus, when a compressive force is applied to the needle tip, the elastically deformable portion is smoothly bent vertically and deforms in a direction perpendicular to the axes in a well-balanced manner. Because of this deformation, the elastically deformable portion can bring the needle tip into stable contact with the electrode when the needle tip is pressed against the electrode.

According to any one of the first to third aspects, a fourth aspect of the present invention is characterized by further including a first restricting member for restricting each needle tip portion from being displaced in a direction perpendicular to both the direction of the axis of the needle tip portion and the direction in which the needle tip portion is displaceable.

According to this aspect, in addition to the effects similar to those of any one of the first to third aspects, each needle tip portion can be restricted from being displaced in a direction perpendicular to both the direction of the axis of the needle tip portion and the direction in which the needle tip portion is displaceable.

In general, in a contact inspection device having a plurality of contacts, other contacts are arranged in an orderly fashion in a direction perpendicular to both the direction of the axis of the needle tip portion and the direction in which the needle tip portion is displaceable. According to this aspect, the first restricting member can reduce the possibility of the contacts adjacent to each other in the array direction contacting and creating a short-circuit.

According to any one of the first to fourth aspects, a fifth aspect of the present invention is characterized by further including a second restricting member for restricting each needle tip portion from being displaced in a direction opposite the direction in which the needle tip portion is displaceable.

According to this aspect, in addition to the effects similar to those of any one of the first to fourth aspects, the second restricting member is provided to restrict each needle tip portion from being displaced in a direction opposite the direction in which the needle tip portion is displaceable. Thus, the second restricting member can restrict each needle tip in contact with an electrode from sliding on the electrode in a direction opposite the direction in which the needle tip portion is displaceable. This further reduces the possibility of the electrodes getting damaged from being scratched by the needle tips.

In addition, because each needle tip portion can be restricted from moving in a direction opposite the direction in which the needle tip portion is displaceable, the distance between the plurality of electrodes provided along the direction in which the needle tip portions are displaceable and the opposite direction can be smaller.

According to any one of the first to fifth aspects, a sixth aspect of the present invention is characterized by the base end portion and the elastically deformable portion of each contact being continued at an obtuse angle with respect to the axis of the base end portion, and the needle tip portion and the elastically deformable portion of each contact being continued at an obtuse angle with respect to the axis of the needle tip portion.

According to this aspect, in addition to the effects similar to those of any one of first to fifth aspects, the base end portion and the elastically deformable portion are continued at an obtuse angle, and the needle tip portion and the elastically deformable portion are continued at an obtuse angle. Thus, the elastically deformable portion has no straight portion formed in a direction normal to the axes of the base end portion and the needle tip portion. Thus, the needle tip portion does not have a cantilever structure and the needle tip is prevented from having a sliding action relative to the electrode.

According to any one of the first to sixth aspects, a contact inspection device according to a seventh aspect of the present invention is characterized by each needle tip being formed to have a convex surface.

According to this aspect, in addition to the effects similar to those of any one of first to sixth aspects, each needle tip is formed to have a convex surface. This enables the needle tip portion to be pivotally tilted about the needle tip thereof smoothly and prevents displacement of the needle tip portion caused by sliding of the needle tip in a direction opposite the direction in which the needle tip portion is displaceable.

According to the seventh aspect, a contact inspection device according to an eighth aspect of the present invention is characterized by the convex surface having a central axis extending parallel to a direction perpendicular to both the direction of the axis of the needle tip portion and the direction in which the needle tip portion is displaceable.

The term "parallel" used herein does not mean that the direction perpendicular to both the direction of the axis of the needle tip portion and the direction in which the needle tip portion is displaceable is completely parallel to the central axis of the convex surface of the needle tip but means that the direction perpendicular to both the direction of the axis of the needle tip portion and the direction in which the needle tip portion is displaceable may not be completely parallel to the central axis of the convex surface of the needle tip as long as the needle tip portion can be pivotally tilted about the needle tip thereof.

According to this aspect, in addition to the effect similar to those of the seventh aspect, the convex surface is formed to have an axis parallel to a direction perpendicular to both the direction of the axis of the needle tip portion and the direction in which the needle tip portion is displaceable. Thus, the direction of the curved surface of the convex surface coincides with the direction in which the needle tip portion is pivotally tilted. This allows the needle tip portion to be pivotally tilted more smoothly and helps to prevent damage to the electrode.

According to any one of the first to eighth aspects, a ninth aspect of the present invention is characterized by a pair of the contacts being brought into contact with an electrode of the test object, and the paired contacts being disposed in a plane-symmetrical relationship.

According to this aspect, in addition to the effects similar to those of any one of first to sixth aspects, a Kelvin connection can be realized. In other words, because each needle tip portion is pivotally tilted about the needle tip thereof, the area of contact between a needle tip and an electrode can be smaller. Thus, a Kelvin connection can be realized between a pair of contacts and an electrode by placing the paired contacts in a plane-symmetrical relationship and bringing the needle tips into contact with the electrode.

BRIEF DESCRIPTION OF THE DRAWINGS

FIG. 1 is a side view of a contact inspection device according to a first embodiment of the present invention.

FIG. 7(A) is a side view of a contact according to a third embodiment, and

FIG. 7(B) is a side view of a contact according to a fourth embodiment.

FIG. 11 is a perspective view of a needle tip according to a tenth embodiment.

FIG. 15(A) is a side view of a cantilever-type contact according to a related art, and FIG. 15(B) is a schematic view illustrating the manner of contact between the needle tip of the cantilever-type contact according to a prior art and an electrode.

DETAILED DESCRIPTION OF THE INVENTION

Embodiment for Carrying out the Invention

Figure 2:
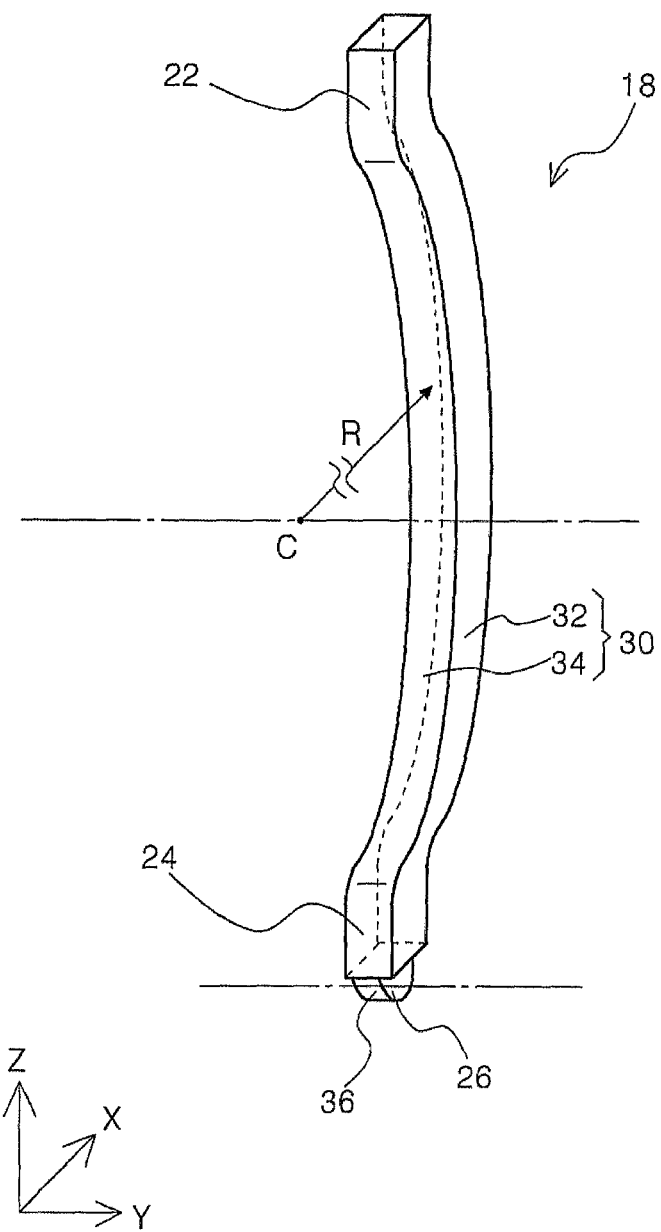
FIG. 2 is a perspective view of a contact according to the first embodiment.

Description is hereinafter made of embodiments of the present invention based on the drawings. The common constituent elements in all the embodiments, which are designated by the same reference numerals, are described only in the first embodiment and their description is omitted in the description of subsequent embodiments.

FIG. 1 shows a probe card 10 as one embodiment of a "contact inspection device." The probe card 10 generally includes a probe substrate 12, an interposer substrate 14, and a plurality of contacts 18 provided on the surface of the interposer substrate 14 to be opposed to a test object 16.

The probe substrate 12 has a plurality of conductive portions 20 formed on the side opposite to the side facing the test object 16 in the Z-axis direction (refer to FIG. 1). Each conductive portion 20 is connected to a tester (not shown). The interposer substrate 14 is placed on the side of the probe substrate 12 facing the test object 16 in the Z-axis direction (refer to FIG. 1). The contacts 18 are arranged in an orderly fashion on one side of the interposer substrate 14, facing the test object 16 in the Z-axis direction (refer to FIG. 1). In addition, a plurality of internal wirings (not shown) is provided in the interposer substrate 14 to connect each contact 18 to a conductive portion 20 of the probe substrate 12 electrically.

Each contact 18 has a base end portion 22, which is described later, connected and fixed to the interposer substrate 14. Each contact 18 also has a needle tip portion 24 having a needle tip 26 to be brought into contact with an electrode 28 of the test object 16 to connect the tester and the electrode 28 electrically via the probe substrate 12 and the interposer substrate 14.

In the case of the contact inspection device 10, after the contacts 18 are brought into contact with the electrodes 28 of the test object 16, the test object 16 is slightly displaced upward in the Z-axis direction in FIG. 1 to press the electrodes 28 of the test object 16 against the contacts 18. Thus, as described later, the needle tip portion 24 of each contact 18 is pivotally tilted about the needle tip 26 to establish a good electrical connection between an electrode 28 and the contact 18.

In the contact inspection device 10, the needle tip portion 24 of each contacts 18 is displaceable in such a direction that the needle tip portion 24 is pivotally tilted about the needle tip 26 thereof with the needle tip 26 pressed against an electrode 28 of the test object 16. In other words, the contact inspection device 10 has a structure in which nothing restricts the needle tip portions 24 from being displaced in the pivotally tilting direction.

First Embodiment

Figure 3:
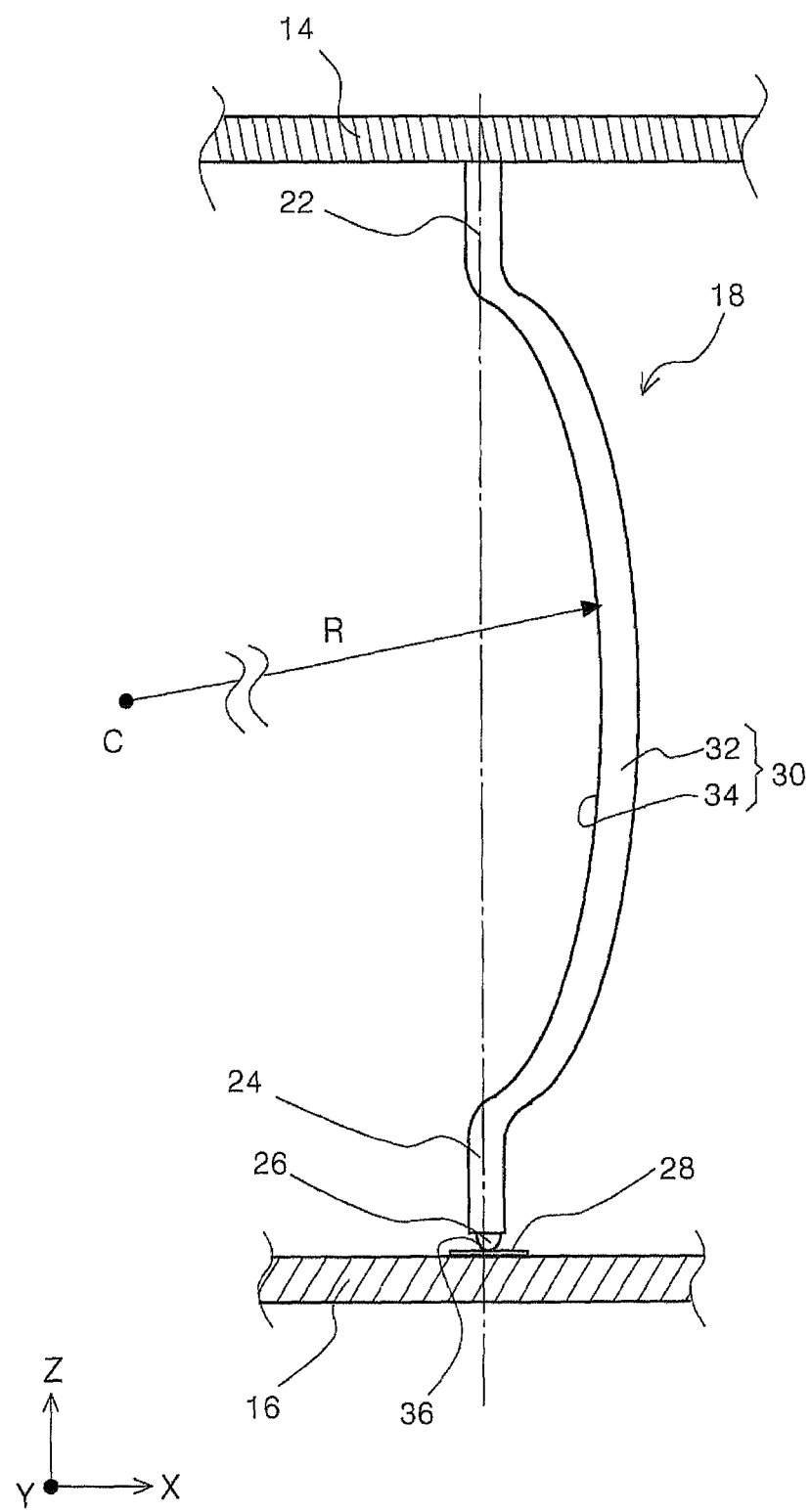
FIG. 3 is a side view of a contact according to the first embodiment.

The contact 18 of the contact inspection device 10 according to the first embodiment is next described in detail. Referring to FIG. 2 and FIG. 3, the contact 18 includes a base end portion 22 connected and fixed to the interposer substrate 14, a needle tip portion 24 having a needle tip 26 which is brought into contact with an electrode 28 of the test object 16, and an elastically deformable portion 30 provided between the base end portion 22 and the needle tip portion 24.

The base end portion 22 extends in the Z-axis direction in FIG. 2 and FIG. 3. The base end portion 22 has a +Z side end fixed to the interposer substrate 14 and a −Z side end which is smoothly continued to the elastically deformable portion 30. The elastically deformable portion 30 extends from the base end portion 22 in the Z-axis direction, and is curved to protrude in the X-axis direction.

The elastically deformable portion 30 has an arcuate portion 32 protruding in the X-axis direction in FIG. 2 and FIG. 3. The arcuate portion 32 is formed as an arc 34. The center C of the arc 34 of the elastically deformable portion 30 is located on the −X side in FIG. 3, which is opposite to the side on which the elastically deformable portion 30 protrudes in the X-axis direction (on the +X side in FIG. 3) with respect to the base end portion 22 and the needle tip portion 24. In other words, the arc 34 is formed as an arc with a radius R around the center C. The elastically deformable portion 30 has a −Z side end which is smoothly continued to into the needle tip portion 24.

The needle tip portion 24 extends in the Z-axis direction and has at the −Z side end thereof a needle tip 26 which is brought into contact with an electrode 28 of the test object 16. The needle tip portion 24 has a central axis in the Z-axis direction which coincides with the central axis of the base end portion 22 in the Z-axis direction.

The needle tip 26 is located at the distal end of the needle tip portion 24, and is formed as a convex surface 36 protruding in the −Z direction. In this embodiment, the needle tip 26 is formed in the shape of a semicircular column so that the apex part of the circle is brought into contact with an electrode 28 of the test object 16. The convex surface 36 of the needle tip 26 has a central axis extending in the Y-axis direction to be parallel to a direction (Y direction) perpendicular to both directions of the axis of the needle tip portion 24 (Z direction) and the line along which the needle tip portion is displaceable (+X direction), which is described later. In other words, the convex surface 36 has a central axis extending parallel to the central axis of the arcuate portion 32 (arc 34) of the elastically deformable portion 30.

The contacts 18 are made of a conducting substance, a low-resistance metal to be more specific, such as iron, copper or nickel, or a nickel alloy such as nickel-cobalt or nickel-copper. The contacts 18 are produced using techniques such as electrocasting, plating, punching (press) and photolithography.

What happens when the contacts 18 are pressed against the electrodes 28 is next described in detail with reference to FIG. 4 and FIG. 5. After the electrodes 28 of the test object 16 are brought into contact with the contacts 18, the test object 16 is displaced by a predetermined amount in the +Z direction. In other words, an overdrive OD is performed, and the contacts 18 are brought into pressure contact with the electrodes 28 of the test object 16.

Figure 4:
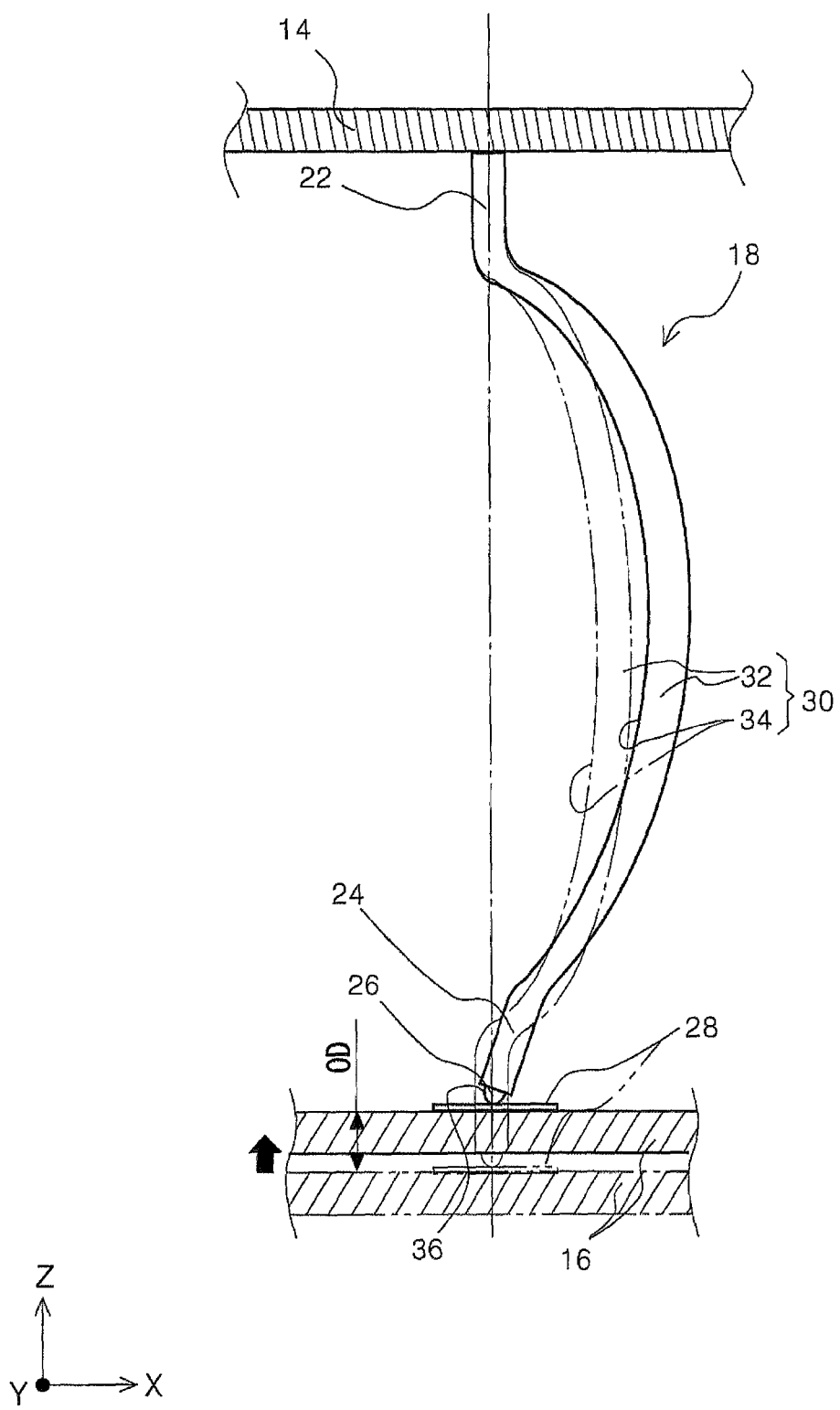
FIG. 4 is a side view illustrating the way the contact according to the first embodiment is pivotally tilted.

As shown in FIG. 4, when the test object 16 is subjected to a predetermined amount of overdrive OD in the +Z direction, a compressive force is applied to each contact 18 along its axis. The elastically deformable portion 30 is bent and deformed in the X direction along the X-axis by this compressive force. As a result of this deformation, the needle tip portion 24 is pivotally tilted about the needle tip 26 thereof in the +X direction according to the amount of deformation in the X direction of the elastically deformable portion 30. In other words, the needle tip portion 24 is pivotally tilted about the needle tip 26 with the +X direction being a displaceable direction.

Figure 5:
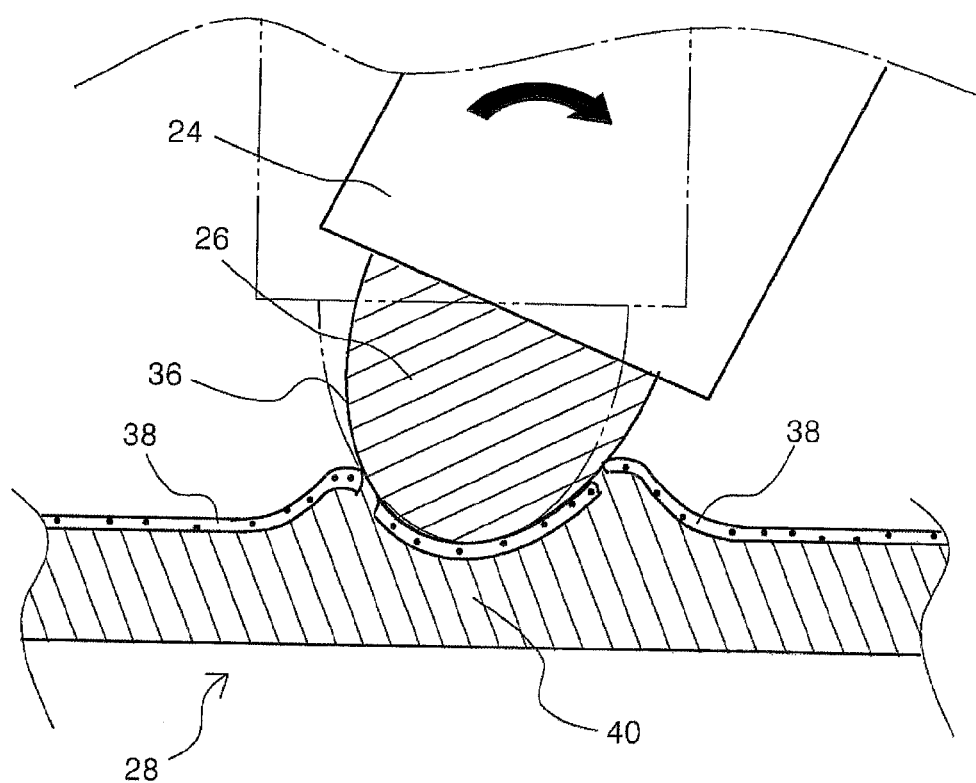
FIG. 5 is a cross-sectional side view illustrating the needle tip of the contact according to the first embodiment in a pivotally tilted position.

As shown in FIG. 5, when pressed against an electrode 28 of the test object 16, the needle tip 26 is pushed into a surface of the electrode 28. Then, the needle tip portion 24 is pivotally tilted in the X direction about the needle tip 26 thereof stuck into the surface of the electrode 28 as a result of the displacement of the elastically deformable portion 30 in the X direction. At this time, the needle tip 26 is restricted from moving in the X-axis direction and Y-axis direction by an oxide film layer 38 on the electrode 28, which is raised around the needle tip 26 when the needle tip is pushed into the surface of the electrode 28. In addition, because the convex surface 36 of the needle tip 26 is formed along the direction in which the needle tip portion 24 is pivotally tilted, the needle tip portion 24 can be pivotally tilted smoothly.

In addition, because friction occurs between the needle tip 26 and the oxide film layer 38 when the needle tip portion 24 is pivotally tilted in the X direction with the needle tip 26 stuck in the electrode 28, cracks are formed in the oxide film layer 38 and a conductive material layer 40 is exposed to the surface of the electrode 28. Because the exposed conductive material layer 40 comes in contact with the needle tip 26, a good electrical connection is established therebetween.

In addition, because the needle tip portion 24 is pivotally tilted with the needle tip 26 thereof stuck in the electrode 28, the surface of the electrode 28 is not scraped off or less likely to be scraped off. Thus, there is no possibility or it is less likely that the oxide film layer 38 adhere to the needle tip 26 in a form of shavings. In addition, the area of contact between the needle tip 26 and the electrode 28 is so small that the electrode 28 is hardly damaged. Further, there is no or little possibility that the durability of the electrode 28 is impaired.

Second Embodiment

A second embodiment is different from the first embodiment in that an elastically deformable portion 42 has a polygonal shape instead of an arcuate shape. The elastically deformable portion 42 is formed as an arcuate portion 44 protruding in the X direction in FIG. 6. The elastically deformable portion 42 has a plurality of straight portions 46 continuously connected to form a polygon as a whole. In addition, when middle points 47 at the connections between the straight portions 46 of the polygonal elastically deformable portion 42 are connected by phantom lines, an arc 48 is formed.

Figure 6:
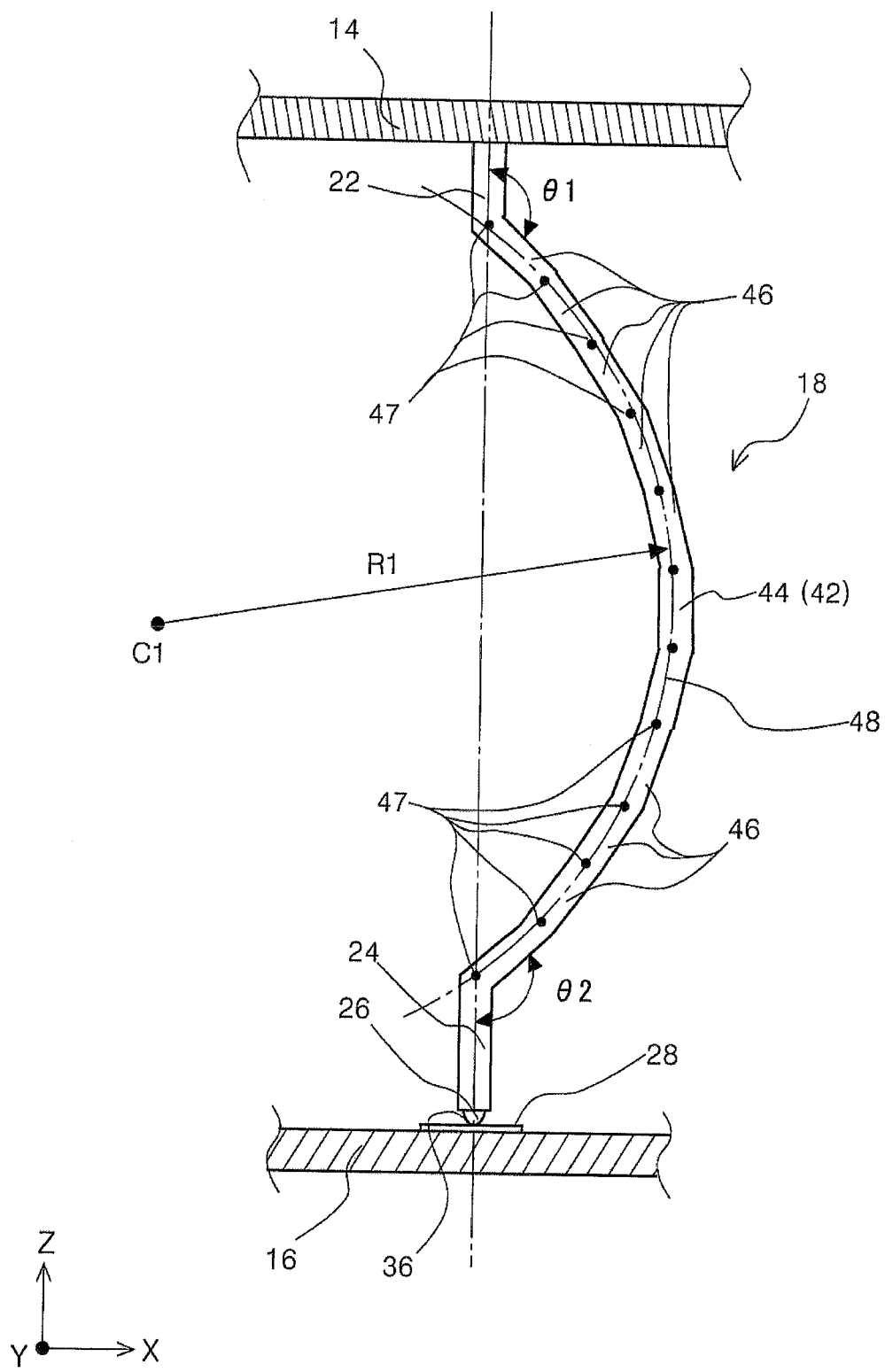
FIG. 6 is a side view of a contact according to a second embodiment.

The center point C1 of the arc 48 formed by the elastically deformable portion 42, i.e., the arcuate portion 44, is located opposite to the side on which the elastically deformable portion 42 protrudes with respect to the base end portion 22 and the needle tip portion 24 (on the −X side in FIG. 6). In addition, an arc 48 formed by connecting the phantom lines is formed as an arc with a radius R1 around the center point C1.

One of the straight portions 46 adjacent to the base end portion 22 is such that its center line and the axis of the base end portion 22 form an obtuse angle θ1. In addition, one of the straight portions 46 adjacent to the needle tip portion 24 is such that its center line and the axis of the needle tip portion 24 form an obtuse angle θ2. It should be noted that the elastically deformable portion 42 needs to have at least two straight portions 46 that form a polygon.

Third Embodiment

A third embodiment is described with reference to FIG. 7(A). The third embodiment is different from the first embodiment in that the axis of the base end portion 22 and the axis of the needle tip portion 24 do not completely coincide with each other. As shown in FIG. 7(A), the axis of the needle tip portion 24 has an axis that is offset from the axis of the base end portion 22 in the −X direction.

As described above, the axis of the base end portion 22 and the axis of the needle tip portion 24 do not necessarily have to coincide exactly with each other. The axis of the needle tip portion 24 may be offset from the axis of the base end portion 22 in the pivotally tilting direction of the needle tip portion 24 or in a direction opposite to the pivotally tilting direction of the needle tip portion 24, as long as the offset falls within a range that allows the needle tip portion 24 to be pivotally tilted about the needle tip 26 thereof.

Fourth Embodiment

A fourth embodiment is described with reference to FIG. 7(B). The fourth embodiment is different from the first embodiment in that a plurality of elastically deformable portions 52 and 54 are provided. A first elastically deformable portion 52 is formed continuously from the base end portion 22. The first elastically deformable portion 52 protrudes in the X direction in FIG. 7(B) to form an arc 56. The center point C3 of the arc 56 formed by the first elastically deformable portion 52 is located opposite to the side on which the first elastically deformable portion 52 protrudes with respect to the axis of the base end portion 22 and the needle tip portion 24 (on the −X side in FIG. 7(B)). In other words, the arc 56 is formed at a distance of radius R3 from the center point C3.

A second elastically deformable portion 54 is formed to be continuous with the first elastically deformable portion 52 and with the needle tip portion 24. The second elastically deformable portion 54 is formed as an arc 58 protruding in the −X direction in FIG. 7(B). The center point C4 of the arc 58 is located opposite to the side on which second elastically deformable portion 54 protrudes with respect to the axis of the base end portion 22 and the needle tip portion 24 (on the X side in FIG. 7(B)). In other words, the arc 58 is formed at a distance of radius R4 from the center point C4.

In this embodiment, the radius R3 of the first elastically deformable portion 52 and the radius R4 of the second elastically deformable portion 54 can be set within a range that allows the needle tip portion 24 to be pivotally tilted about the needle tip 26 thereof relative to the electrode 28. Also, in this embodiment, when the first elastically deformable portion 52 is deformed, the first elastically deformable portion 52 pushes the second elastically deformable portion 54 in the −X direction, making it easy for the needle tip portion 24 to be pivotally tilted. Note that in the illustrated example, the needle tip portion 24 is pivotally tilted in the −X side about the needle tip 26 thereof.

Fifth Embodiment

Figure 8:
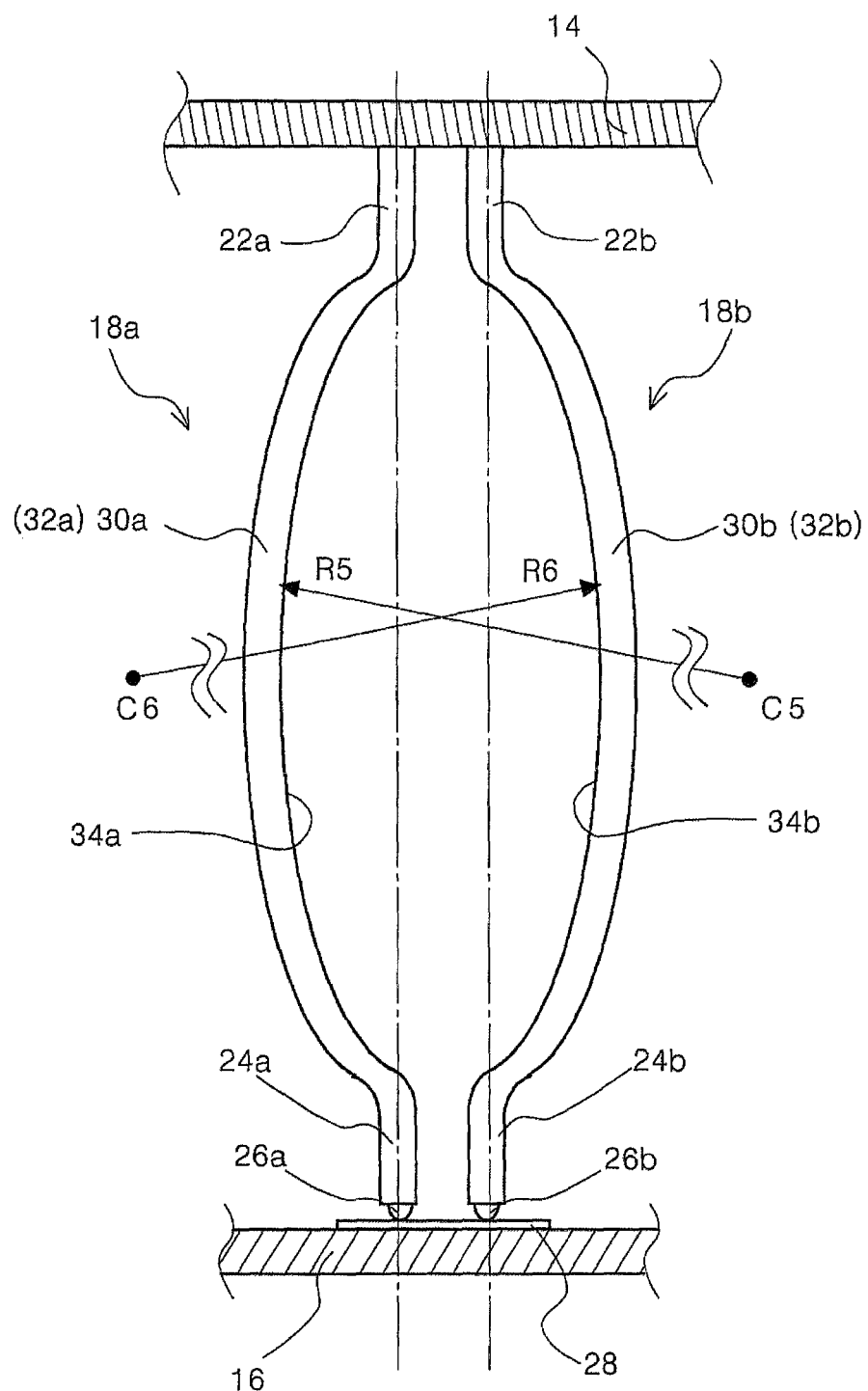
FIG. 8 is a side view of a contact according to a fifth embodiment.

A fifth embodiment is described with reference to FIG. 8. The fifth embodiment is different in that a pair of the contacts 18 according to the first embodiment is provided for each electrode 28 which is provided in plurality on the test object 16. As shown in FIG. 8, a pair of first and second contacts 18a and 18b is arranged in a plane-symmetrical relationship, and the center point C5 of the arc 34a of the first contact 18a is located on the side where the elastically deformable portion 30b of the second contact 18b protrudes. The center point C6 of the arc 34b of the second contact 18b is located on the side where the elastically deformable portion 30a of the first contact 18a protrudes.

In this embodiment, because there is no or little possibility that the needle tips 26a and 26b slide in the X-axis direction toward each other, there is no or little possibility that the needle tip 26a of the first contact 18a and the needle tip 26b of the second contact 18b come in contact with each other to cause a short-circuit. Thus, the distance between the needle tip 26a of the first contact 18a and the needle tip 26b of the second contact 18b can be so small that two contacts 18a and 18b can be provided for one of the electrodes 28 of the test object 16.

In this case, a Kelvin contact can be realized in a compact manner by measuring a potential difference with the first contact 18a and measuring a current with the second contact 18b.

Sixth To Tenth Embodiment

The needle tip 26 can have a different shape when the contact 18 is seen from a side (in the Y-axis direction). FIG. 9(A), FIG. 9(B), FIG. 10(A), FIG. 10(B) and FIG. 11, show different shapes of the needle tip 26. FIG. 9(A), FIG. 9(B), FIG. 10(A), FIG. 10(B) and FIG. 11 show perspective views of needle tip 60, 64, 68, 72 and 78 according to sixth to tenth embodiments, respectively.

Figure 9:
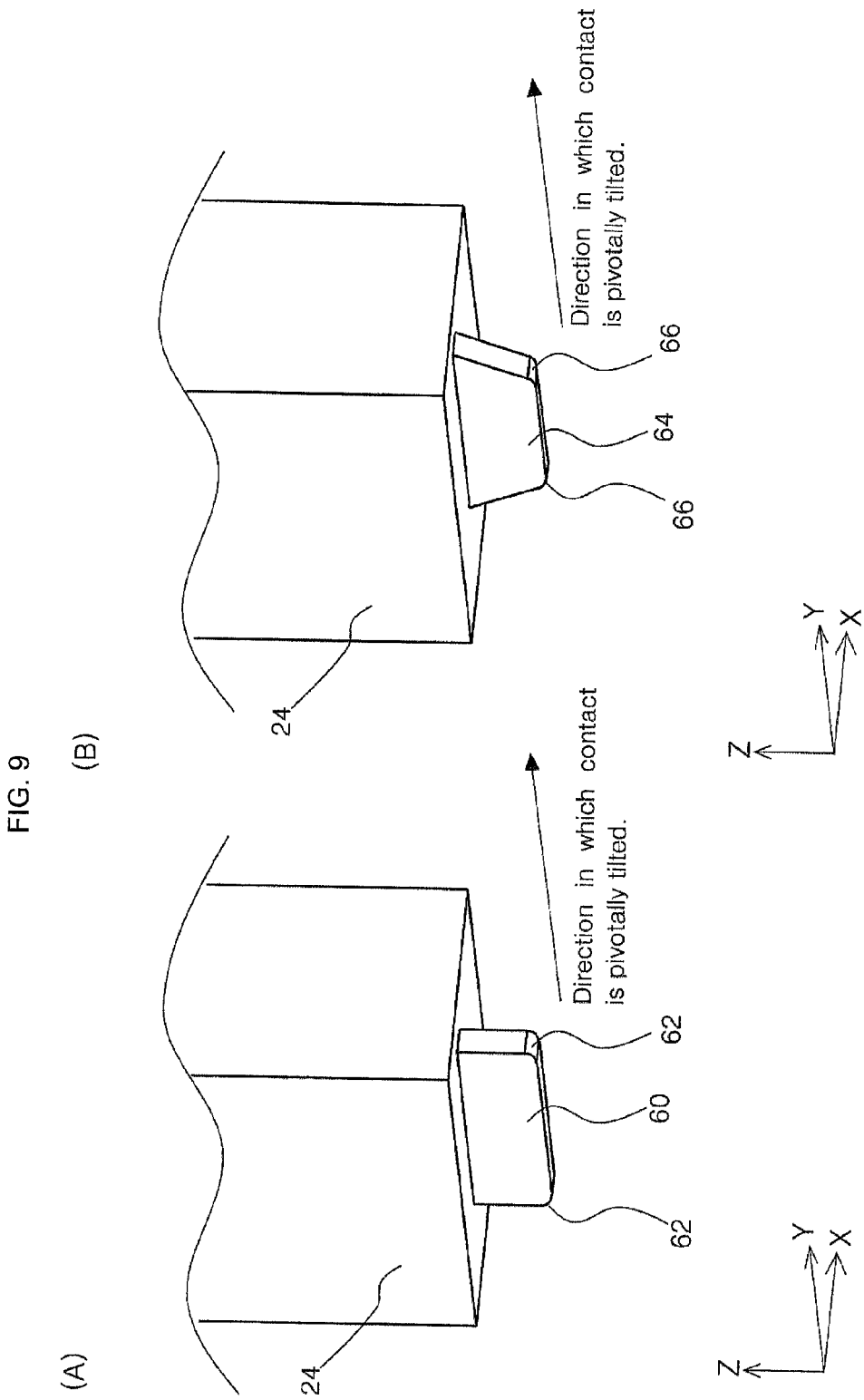
FIG. 9(A) is a perspective view of a needle tip according to a sixth embodiment.
FIG. 9(B) is a perspective view of a needle tip according to a seventh embodiment.

The needle tip 60 according to a sixth embodiment shown in FIG. 9(A) is formed in a rectangular shape along the X-axis direction. Corners 62, which are brought into contact with the electrode 28 when the needle tip portion 24 is pivotally tilted in the X-axis direction about the needle tip 60, are chamfered into a round shape so that the needle tip portion 24 can be pivotally tilted easily.

The needle tip 64 according to a seventh embodiment shown in FIG. 9(B) is formed in a trapezoidal shape along the X-axis direction. The corners 66, which are brought into contact with the electrode 28 when the needle tip portion 24 is pivotally tilted in the X-axis direction about the needle tip 64, are chamfered into a round shape so that the needle tip portion 24 can be pivotally tilted easily.

Figure 10:
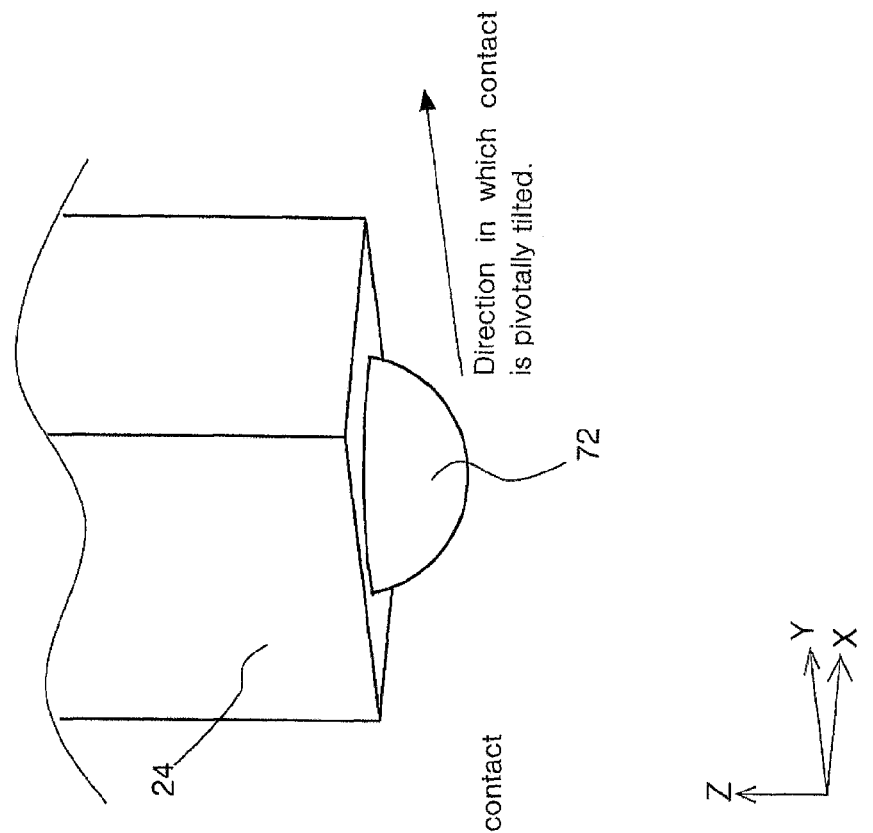
FIG. 10(A) is a perspective view of a needle tip according to an eighth embodiment.
FIG. 10(B) is a perspective view of a needle tip according to a ninth embodiment.

The needle tip 68 according to an eighth embodiment shown in FIG. 10(A) is formed in a rectangular shape along the X-axis direction. In contrast to the sixth embodiment, the corners 70, which are brought into contact with the electrode 28 when the needle tip portion 24 is pivotally tilted in the X-axis direction about the needle tip 68, are not chamfered. Thus, when the needle tip portion 24 is pivotally tilted, the corners 70 bite into the electrode 28 and restrict the needle tip portion 24 from moving in the X-axis direction.

The needle tip 72 according to a ninth embodiment shown in FIG. 10(B) is formed in a hemispherical shape in the X-axis direction and the Y direction. Because an area of contact having a circular shape on the XY plane is formed between the needle tip 72 and the electrode 28, the needle tip 72 is restricted from moving in the X direction and Y direction when the needle tip 72 is pressed against the electrode 28 and tucked into the electrode 28. Thus, when the needle tip portion 24 is pivotally tilted, the needle tip 72 restricts the needle tip portion 24 from moving in both the X-axis direction and Y-axis direction.

The needle tip 78 according to a tenth embodiment shown in FIG. 11 is different from the needle tip 60 according to the sixth embodiment shown in FIG. 9(A) in that the needle tip 78 is formed to intersect the pivotally tilting direction, The needle tip 78 is formed in a rectangular shape along the Y-axis direction. In addition, the corners 80 which are brought into contact with the electrode 28 when the needle tip portion 24 is pivotally tilted in the X-axis direction about the needle tip 78, are not chamfered.

Thus, when the needle tip portion 24 is pivotally tilted, the corner portions 80 dig into the electrode 28 and restrict the needle tip portion 24 from moving in the X-axis direction. In addition, the corner portions 80, which make a line contact with the electrode 28, can increase the current-conduction section and improve the electrical conductivity.

Eleventh Embodiment

Figure 12:
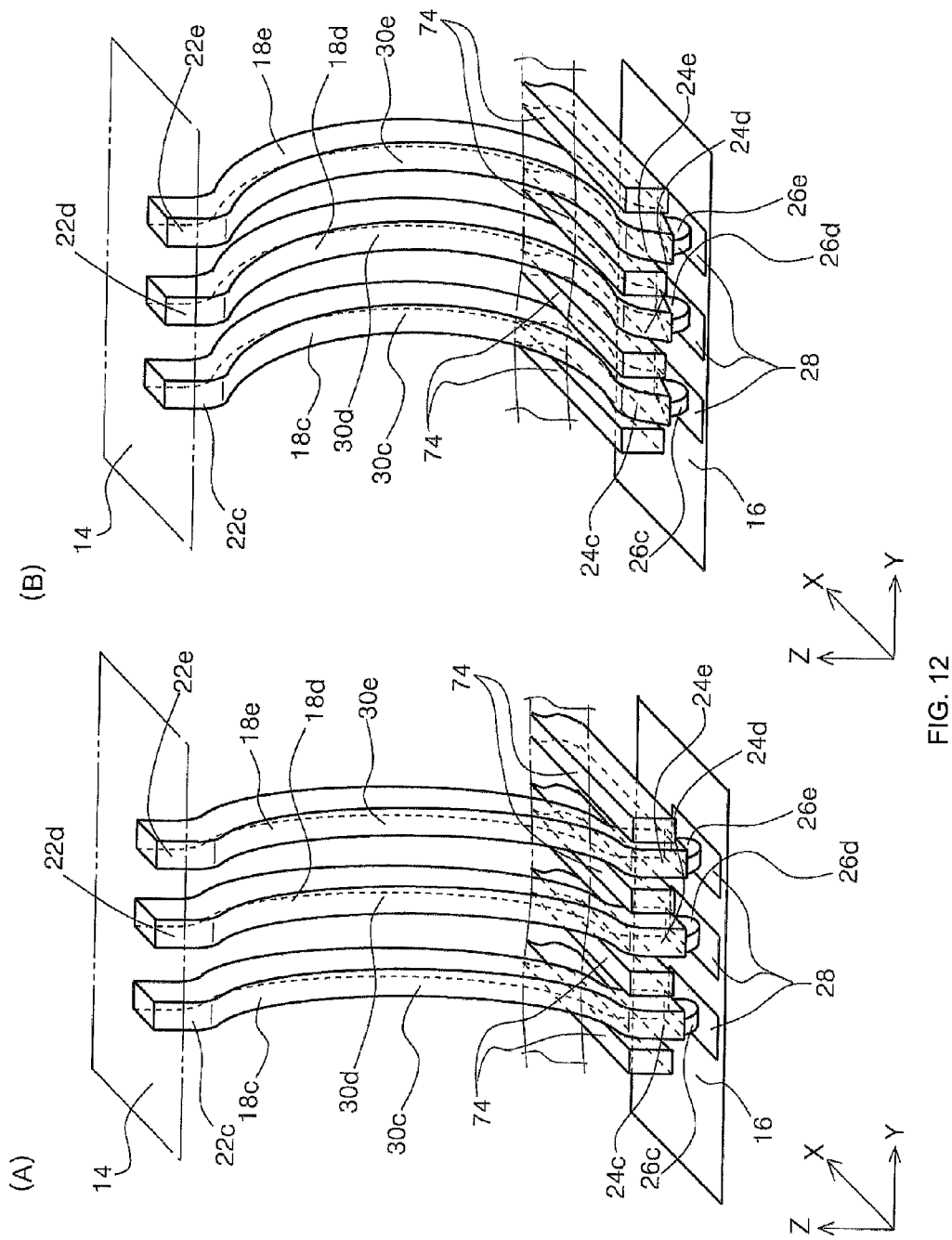
FIG. 12(A) is a perspective view of contacts according to an eleventh embodiment in the position before being pivotally tilted.
FIG. 12(B) is a perspective view of the contacts according to the eleventh embodiment in the position after being pivotally tilted.

An eleventh embodiment is described with reference to FIG. 12(A) and FIG. 12(B). FIG. 12(A) is a perspective view illustrating contacts before being pivotally tilted, and FIG. 12(B) is a perspective view illustrating contacts after being pivotally tilted.

In the eleventh embodiment, the contact inspection device 10 has first restricting members between the contacts 18 arranged in a row in the Y-axis direction for restricting the contacts 18 from being displaced in the Y-axis direction.

FIG. 12(A) shows a state in which the needle tips 26 of the contacts 18 are respectively in contact with electrodes 28 of the test object 16. The contacts 18c, 18d and 18e are arranged in a row in the Y-axis direction in a spaced-apart relationship. The first restricting members 74 are located between the needle tip portions 24c, 24d and 24e of the contacts 18c, 18d and 18e and extend in the X-axis direction. The first restricting members 74 are made of an insulating material, such as ceramic.

Thus, when the contact 18d, for example, is urged to move in the Y direction by some force, the first restricting members 74 restrict the contact 18d from being displaced in the Y direction to prevent a short-circuit with the adjacent contact 18c or 18e. Thus, the distance between the electrodes 28 of the test object 16 in the Y-axis direction can be smaller.

FIG. 12(B) shows a state after the needle tips 26 of the contacts 18 have been pivotally tilted. As shown in the drawing, the first restricting members 74, which are located between the contacts 18c, 18d and 18e in the Y-axis direction, do not prevent the needle tip portions 24c, 24d and 24e from being pivotally tilted with the contacts 18c, 18d and 18e pressed against the electrodes 28.

Twelfth Embodiment

Figure 13:
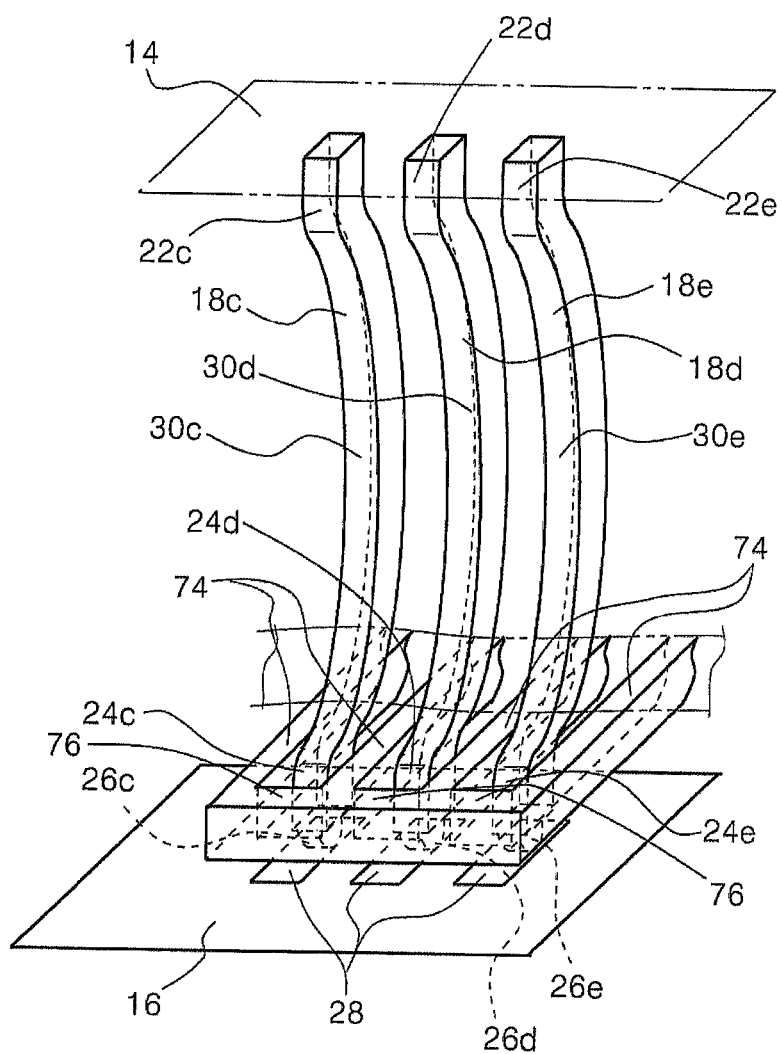
FIG. 13 is a perspective view of contacts according to a twelfth embodiment in the position before being pivotally tilted.
Figure 14:
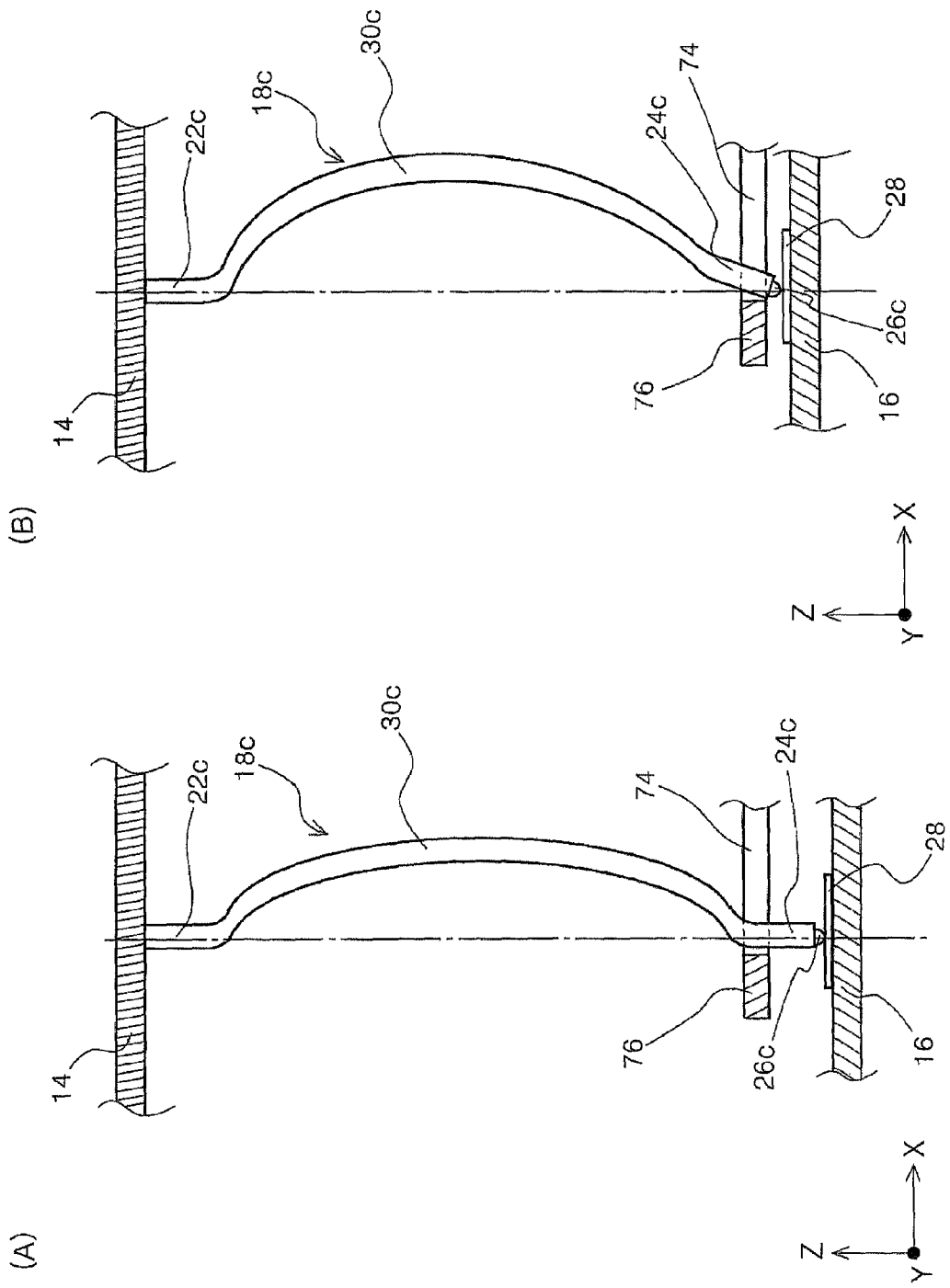
FIG. 14(A) is a side view of a contact according to the twelfth embodiment in the position before being pivotally tilted.
FIG. 14(B) is a side view of the contact according to the twelfth embodiment in the position after being pivotally tilted.
Figure 16:
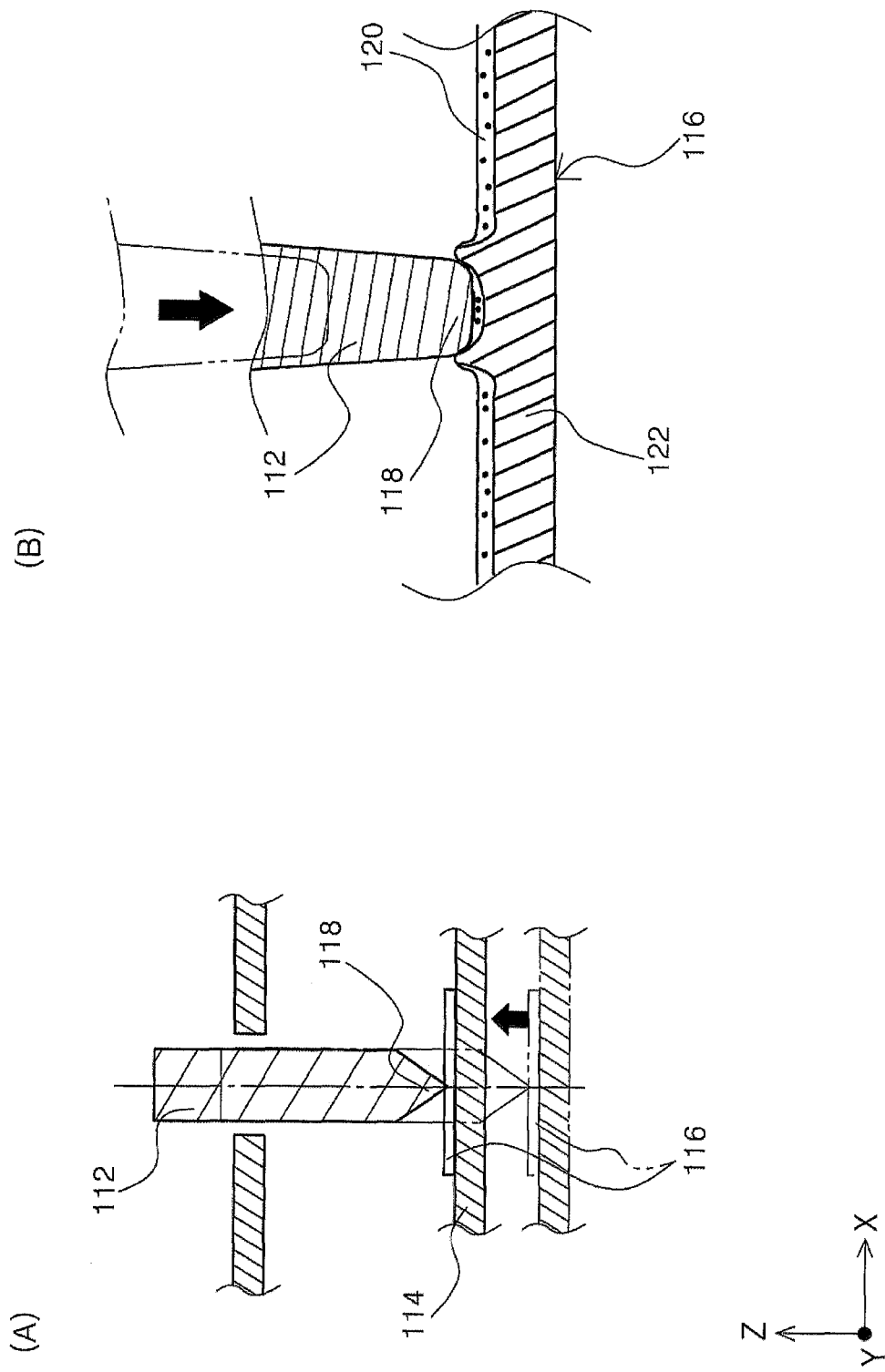
FIG. 16(A) is a side view of a needle-type contact according to a prior art.
FIG. 16(B) is a schematic view illustrating the manner of contact between the needle tip of the needle-type contact according to a prior art and an electrode.

A twelfth embodiment is described with reference to FIG. 13, FIG. 14(A) and FIG. 14(B). The twelfth embodiment is different from the eleventh embodiment in that the contact inspection device 10 has a second restricting member 76 for restricting the needle tip portions from sliding in the −X direction on the side opposite the side on which the elastically deformable portions 30 of the contacts protrude.

The contact inspection device 10 has the first restricting members 74, and a second restricting member 76 which faces the needle tip portions 24c, 24d and 24e of the contacts 18c, 18d and 18e on the opposite side of the protrusion of the elastically deformable portions 30, and is located in the vicinity of the needle tip portions 24c, 24d and 24e at a small distance. The second restricting member 76 does not restrict the needle tips 26c, 22d and 22e from being pivotally tilted toward the protruding side of the elastically deformable portions 30 (the +X side) but restricts the sliding of the needle tips 26c, 22d and 22e in the −X direction which may be caused by some external factor.

This configuration can also prevent the contacts 18 arranged in an orderly fashion in the X-axis direction on the interposer substrate 14 from contacting with each other in the X-axis direction to cause short-circuit. Thus, the distance between the electrodes 28 of the test object 16 in the X-axis direction can be smaller.

While the contact inspection device 10 has the first restricting members 74 and the second restricting member 76 in this embodiment, the contact inspection device 10 may have only the second restricting member 76.

The above description can be summarized as follows. The probe card (contact inspection device) 10 according to this embodiment is a probe card (contact inspection device) 10 including contacts 18 to be brought into contact with a test object 16 for inspection, with each contact 18 having a base end portion 22, a needle tip portion 24 having a needle tip 26 to be brought into contact with the test object 16, and an elastically deformable portion 30 located between the base end portion 22 and the needle tip portion 24, the base end portion 22 and the needle tip portion 24 having axes which coincide with each other, the elastically deformable portion 30 is deformable under a compressive force applied in the direction of the axis of the needle tip portion 24 while the needle tip 26 is pressed against the test object 16, and to convert the compressive force into a tilting motion of the needle tip portion 24 about the needle tip 26 thereof through the deformation, and the contact inspection device 10 being such that the needle tip portion 24 of each contact 18 is displaceable in a direction in which the needle tip portion 24 is pivotally tilted about the needle tip 26 thereof while the needle tip 26 is pressed against the test object 16.

In addition, the probe card 10 according to this embodiment is a probe card 10 including contacts 18 to be brought into contact with a test object 16 for inspection, with each contact 18 having a base end portion 22, a needle tip portion 24 having a needle tip 26 to be brought into contact with the test object 16, and an elastically deformable portion 30 located between the base end portion 22 and the needle tip portion 24, the base end portion 22 and the needle tip portion 24 having axes which coincide with each other, the elastically deformable portion 30 having an arcuate portion 32 protruding in a direction perpendicular to the axes of the base end portion 22 and the needle tip portion 24, the arcuate portion 32 being the center point C of the circle of which the arcuate portion 32 forms a part is located on the opposite side of the arcuate portion 32 with respect to the axes of the base end portion 22 and the needle tip portion 24, and the probe card 10 being such that the needle tip portion 24 of each contact 18 is displaceable in a direction in which the arcuate portion 32 protrudes while the needle tip 26 is pressed against the test object 16.

The elastically deformable portion 30 has an arcuate portion 32 protruding in a direction perpendicular to the axes of the base end portion 22 and the needle tip portion 24, and the arcuate portion 32 is formed in the shape of an arc 34. The contact inspection device 10 includes a first restricting member 74 for restricting each needle tip portion 24 from being displaced in a direction (Y-axis direction), which is perpendicular to both of Z-axis direction (axis direction of the needle tip portion 24) and the +X direction (direction in which the needle tip portion 24 is displaceable).

The contact inspection device 10 also includes a second restricting member 76 for restricting each needle tip portion 24 from being displaced in the −X direction, which is opposite to the +X direction in which the needle tip portion 24 is displaceable.

In probe card 10, the base end portion 22 and the elastically deformable portion 30 is continued at an obtuse angle with respect to the axis of the base end portion 22, and the needle tip portion 24 and the elastically deformable portion 30 is continued at an obtuse angle with respect to the axis of the needle tip portion 24.

Each needle tip 26 is formed to have a convex surface 36. In addition, the convex surface 36 has a central axis extending parallel to a direction (Y-axis direction) perpendicular to both the direction of the axis of the needle tip portion 24 (Z-axis direction) and the direction in which the needle tip portion 24 is displaceable (+X direction). Further, in the probe card 10, a pair of the contacts 18 is brought into contact with an electrode 28 of the test object 16, and the paired contacts 18 are disposed in a plane-symmetrical relationship.

It goes without saying that the present invention is not limited to the above embodiments and various modification are possible within the scope of the invention set forth in the claims and such modifications are also included in the scope of the present invention.

DESCRIPTION OF REFERENCE NUMERALS
AND SYMBOLS

10: contact inspection device
12: probe substrate
14: interposer substrate
16: test object
18, 18a, 18b, 18c, 18d, 18e: contact
20: conductive portion
22: base end portion
28: electrode
24, 24a, 24b, 24c, 24d, 24e: needle tip portion
26, 26a, 26b, 26c, 26d, 26e, 60, 64, 68, 72, 78: needle tip
30, 30a, 30b, 30c, 30d, 30e, 42, 50: elastically deformable portion
32, 32a, 32b, 44: arcuate portion
34, 34a, 34b, 48, 56, 58: arc
36: convex surface
38: oxide film layer
40: conductive material layer
46: straight portion
47: middle point
52: first elastically deformable portion
54: second elastically deformable portion
62, 66, 70, 80: corner portion
74: first restricting member
76: second restricting member C, C1, C2, C3, C4, C5, C6: center point
OD: overdrive
R, R1, R2, R3, R4, R5, R6: radius
θ1, θ2: obtuse angle

The invention claimed is:

1. A contact inspection device comprising:
a plurality of contacts, which are brought into contact with a test object for inspection; and
a plurality of first restricting members, wherein
each of the contacts contains:
a base end portion, one end of which abuts a substrate;
a needle tip portion having a needle tip to be brought into contact with the test object; and
an elastically deformable portion being located between the base end portion and the needle tip portion,
axes of the base end portion and the needle tip portion coincide with each other in a state where the needle tip portion is not pressed against the test object, and the base end portion and the elastically deformable portion are integrally connected in the state where the axes coincide with each other,
the elastically deformable portion is deformable under a compressive force applied in a direction of the axis of the needle tip portion while the needle tip is pressed against the test object, to convert the compressive force into a pivotal tilting motion of the needle tip portion about the needle tip thereof through the deformation,
the contact inspection device is configured such that the needle tip portion is displaced in a direction in which the needle tip portion is pivotally tilted about the needle tip when the needle tip is pressed against the test object, and
each of the first restricting members is configured to restrict each needle tip portion from being displaced in a direction perpendicular to both the direction of the axis of the needle tip portion and a tilting direction in which the needle tip portion is tilted without restricting the needle tip portion in the tilting direction.

2. The contact inspection device according to claim 1, wherein the elastically deformable portion has an arcuate portion protruding in a direction perpendicular to the axes of the base end portion and the needle tip portion, and
the arcuate portion has a shape of an arc.

3. The contact inspection device according to claim 1, further comprising a second restricting member for restricting each needle tip portion from being displaced in a direction opposite the direction in which the needle tip portion is displaceable.

4. The contact inspection device according to claim 3, wherein the base end portion and the elastically deformable portion of each contact are continued at an obtuse angle with respect to the axis of the base end portion, and
the needle tip portion and the elastically deformable portion of each contact are continued at an obtuse angle with respect to the axis of the needle tip portion.

5. The contact inspection device according to claim 1, wherein the base end portion and the elastically deformable portion of each contact are continued at an obtuse angle with respect to the axis of the base end portion, and
the needle tip portion and the elastically deformable portion of each contact are continued at an obtuse angle with respect to the axis of the needle tip portion.

6. The contact inspection device according to claim 1, wherein each needle tip has a convex surface.

7. The contact inspection device according claim 6, wherein the convex surface has a central axis extending parallel to a direction perpendicular to both the direction of the axis of the needle tip portion and the direction in which the needle tip portion is displaceable.

8. The contact inspection device according to claim 1, wherein a pair of the contacts is brought into contact with an electrode of the test object, and the paired contacts are disposed in a plane-symmetrical relationship.

9. The contact inspection device according to claim 1, wherein the base end portion and the elastically deformable portion of each contact are continued at an obtuse angle with respect to the axis of the base end portion, and
the needle tip portion and the elastically deformable portion of each contact are continued at an obtuse angle with respect to the axis of the needle tip portion.

10. A contact inspection device comprising:
a plurality of contacts, which are brought into contact with a test object for inspection; and
a plurality of first restricting members, wherein
each of the contacts contains:
a base end portion, one end of which abuts a substrate;
a needle tip portion having a needle tip to be brought into contact with the test object; and
an elastically deformable portion being located between the base end portion and the needle tip portion,
axes of the base end portion and the needle tip portion coincide with each other in a state where the needle tip portion is not pressed against the test object, and the base end portion and the elastically deformable portion are integrally connected in the state where the axes coincide with each other,
the elastically deformable portion has an arcuate portion protruding in a direction perpendicular to the axes of the base end portion and the needle tip portion,
the arcuate portion is configured such that a center point of a circle formed by the arcuate portion is located on an opposite side of the arcuate portion with respect to the axes of the base end portion and the needle tip portion,
the contact inspection device is configured such that when the needle tip is pressed against the test object, the needle tip portion is displaced in a direction in which the needle tip portion is pivotally tilted about the needle tip and in which the arcuate portion on the elastically deformable portion protrudes, and
each of the first restricting members is configured to restrict each needle tip portion from being displaced in a direction perpendicular to both the direction of the axis of the needle tip portion and a tilting direction in which the needle tip portion is tilted without restricting the needle tip portion in the tilting direction.

11. The contact inspection device according to claim 10, wherein the arcuate portion has a shape of an arc.

12. The contact inspection device according to claim 10, further comprising a second restricting member for restricting each needle tip portion from being displaced in a direction opposite the direction in which the needle tip portion is displaceable.

13. The contact inspection device according to claim 12, wherein the base end portion and the elastically deformable portion of each contact are continued at an obtuse angle with respect to the axis of the base end portion, and the needle tip portion and the elastically deformable portion of each contact are continued at an obtuse angle with respect to the axis of the needle tip portion.

14. The contact inspection device according to claims 10, wherein the base end portion and the elastically deformable portion of each contact are continued at an obtuse angle with respect to the axis of the base end portion, and the needle tip portion and the elastically deformable portion of each contact are continued at an obtuse angle with respect to the axis of the needle tip portion.

15. The contact inspection device according to claim 10, wherein each needle tip has a convex surface.

16. The contact inspection device according claim 15, wherein the convex surface has a central axis extending parallel to a direction perpendicular to both the direction of the axis of the needle tip portion and the direction in which the needle tip portion is displaceable.

17. The contact inspection device according to claim 10, wherein a pair of the contacts is brought into contact with an electrode of the test object, and the paired contacts are disposed in a plane-symmetrical relationship.

18. The contact inspection device according to claim 10, wherein the base end portion and the elastically deformable portion of each contact are continued at an obtuse angle with respect to the axis of the base end portion, and the needle tip portion and the elastically deformable portion of each contact are continued at an obtuse angle with respect to the axis of the needle tip portion.

19. A contact inspection device comprising:
a plurality of contacts, which are brought into contact with a test object for inspection; and
a plurality of first restricting members, wherein
each of the contacts contains:
   a base end portion, one end of which abuts a substrate;
   a needle tip portion having a needle tip to be brought into contact with the test object; and
   an elastically deformable portion being located between the base end portion and the needle tip portion,
axes of the base end portion and the needle tip portion coincide with each other in a state where the needle tip portion is not pressed against the test object, and the base end portion and the elastically deformable portion are integrally connected in such a state where the axes coincide with each other,
the contact inspection device is configured such that when the needle tip is pressed against the test object, the needle tip portion is displaced in a direction in which the needle tip portion is pivotally tilted about the needle tip and in which a portion on the elastically deformable portion protrudes, and
each of the first restricting members is configured to restrict each needle tip portion from being displaced in a direction perpendicular to both the direction of the axis of the needle tip portion and a tilting direction in which the needle tip portion is tilted without restricting the needle tip portion in the tilting direction.

* * * * *